(12) United States Patent
Chen (10) Patent No.: US 12,041,722 B2
(45) Date of Patent: Jul. 16, 2024

(54) ELECTRONIC DEVICE

(71) Applicant: InnoLux Corporation, Miao-Li County (TW)

(72) Inventor: Hsin-Li Chen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 17/935,257

(22) Filed: Sep. 26, 2022

(65) Prior Publication Data
US 2023/0021028 A1   Jan. 19, 2023

Related U.S. Application Data

(63) Continuation of application No. 17/069,175, filed on Oct. 13, 2020, now Pat. No. 11,490,521.

(30) Foreign Application Priority Data

Oct. 29, 2019 (CN) .......................... 201911036447.3

(51) Int. Cl.
*H05K 1/18* (2006.01)
(52) U.S. Cl.
CPC ..... *H05K 1/189* (2013.01); *H05K 2201/0338* (2013.01); *H05K 2201/10128* (2013.01)
(58) Field of Classification Search
CPC ...... H05K 1/189; H05K 1/028; H05K 1/0281; H05K 1/09; H05K 1/11; H05K 1/147; H05K 2201/0338; H05K 2201/10128; H05K 2201/09154; H05K 2201/0919; H05K 2201/09209; H05K 2201/0921; H05K 2201/18331; H05K 2201/032; H05K 2201/0332; H05K 2201/09845; H05K 3/323; H05K 3/321; H05K 3/361; H05K 3/363; H05K 3/281; H05K 3/386; H05K 2203/0369
See application file for complete search history.

(56) References Cited

U.S. PATENT DOCUMENTS

| | | | | |
|---|---|---|---|---|
| 8,314,338 | B2* | 11/2012 | Ishii | H05K 3/363 |
| | | | | 361/784 |
| 2007/0030433 | A1* | 2/2007 | Kudo | H05K 3/323 |
| | | | | 349/149 |
| 2010/0263208 | A1* | 10/2010 | Arifuku | H05K 3/361 |
| | | | | 29/830 |
| 2010/0307797 | A1* | 12/2010 | Watanabe | H05K 3/281 |
| | | | | 29/829 |
| 2017/0231087 | A1* | 8/2017 | Matsumura | H05K 3/4644 |

* cited by examiner

*Primary Examiner* — Roshn K Varghese
(74) *Attorney, Agent, or Firm* — McClure, Qualey & Rodack, LLP (57) ABSTRACT

An electronic device is provided. The electronic device includes a flexible circuit board and a conductive adhesive material. The flexible circuit board includes a first conductive layer, an adhesive layer, and a cover layer. The first conductive layer has a top surface, a bottom surface parallel to the top surface and a first side connected between the top surface and bottom surface. The adhesive layer is disposed on the top surface of the first conductive layer. The cover layer is disposed on the adhesive layer. The conductive adhesive material is disposed on the first conductive layer. In addition, the conductive adhesive material is in contact with the first side.

15 Claims, 6 Drawing Sheets

ELECTRONIC DEVICE

CROSS REFERENCE TO RELATED APPLICATIONS

This application is a Continuation of application Ser. No. 17/069,175, filed Oct. 13, 2020 and entitled "FLEXIBLE CIRCUIT BOARD AND DISPLAY DEVICE" (now U.S. Pat. No. 11,490,521, issued Nov. 1, 2022), which claims priority of China Patent Application No. 201911036447.3, filed on Oct. 29, 2019, the entirety of which is incorporated by reference herein.

BACKGROUND

Technical Field

The present disclosure relates to a flexible circuit board, and in particular it relates to a flexible circuit board having an adhesive layer.

Description of the Related Art

Flexible circuit boards such as flexible printed boards (FPC) are widely used in electronic products including display panels, such as smartphones, tablet computers, notebook computers, displays, and televisions. The flexible circuit board can change its shape according to the space design of electronic products. Following the trend of technological electronic products emphasizing lightness, thinness and flexibility, the industry has high expectations for improvements to the performance of flexible circuit boards.

Although existing flexible circuit boards have been adequate for their intended purposes, they have not been entirely satisfactory in all respects. For example, the external bending force makes the stress easily concentrated on the bonding area of the flexible circuit boards, so that the circuit is broken, the electrical signal transmission is abnormal, or the electrical connection cannot be achieved.

Therefore, the development of a structural design that can improve the reliability or quality of a flexible circuit board is still one of the current research topics in the industry.

SUMMARY

In accordance with some embodiments of the present disclosure, an electronic device is provided. The electronic device includes a flexible circuit board and a conductive adhesive material. The flexible circuit board includes a first conductive layer, an adhesive layer, and a cover layer. The first conductive layer has a top surface, a bottom surface parallel to the top surface and a first side connected between the top surface and bottom surface. The adhesive layer is disposed on the top surface of the first conductive layer. The cover layer is disposed on the adhesive layer. The conductive adhesive material is disposed on the first conductive layer. In addition, the conductive adhesive material is in contact with the first side.

In accordance with some embodiments of the present disclosure, an electronic device is provided. The electronic device includes a flexible circuit board, a conductive adhesive material, and a display. The display is disposed adjacent to the flexible circuit board. The flexible circuit board includes a first conductive layer, an adhesive layer, and a cover layer. The first conductive layer has a top surface, a bottom surface parallel to the top surface and a first side connected between the top surface and bottom surface. The adhesive layer is disposed on the top surface of the first conductive layer. The cover layer is disposed on the adhesive layer. The conductive adhesive material is disposed on the first conductive layer. The conductive adhesive material is in contact with the first side. In addition, the display has a bonding area, a second conductive layer is disposed on the bonding area, and the first conductive layer is electrically connected to the second conductive layer.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

The flexible circuit board and the display device of the present disclosure are described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. The embodiments are used merely for the purpose of illustration. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

It should be understood that some of the elements or devices of the drawings may exist in various forms well-known to those of ordinary skill in the art. In addition, in embodiments, relative terms may be used, such as "lower" or "bottom" or "higher" or "top" to describe the relative relationship of one element to another element in the drawing. It should be appreciated that if a device is flipped upside down, an element that is on the "bottom" will become an element that is on the "top". The descriptions of the exemplary embodiments are intended to be read in connection with the accompanying drawings, which are to be considered part of the entire written description. It should be understood that the drawings are not drawn to scale. In fact, the size of the element may be arbitrarily enlarged or reduced in order to clearly show the features of the present disclosure.

Furthermore, when a first material layer is disposed on or on a second material layer, it may include the situation where the first material layer and the second material layer are in direct contact, or the first material layer and the second material are not in direct contact and one or more intervening layers may be present. However, if the first material layer is directly on the second material layer, it means that the first material layer and the second material layer are in direct contact.

It should be understood that, although the terms "first", "second", "third" etc. may be used herein to describe various elements, components, or portions, these elements, components, or portions should not be limited by these terms. These terms are only used to distinguish one element, component, or portion from another element, component, or portion. Thus, a first element, component, or portion discussed below could be termed a second element, component, or portion without departing from the teachings of the present disclosure.

In accordance with some embodiments of the present disclosure, terms such as "connect" and "interconnect" with respect to joint and connection, unless specifically defined, may refer to the two structures being in direct contact, or may refer to the two structures not being in direct contact, there being other structures between these two structures. In addition, terms related to joints and connection may also include a situation where both structures are movable or both structures are fixed.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, the provided flexible circuit board includes a design of an adhesive layer that extends beyond the cover layer, which can reduce the concentration of stress on the boundary between the adhesive layer and the conductive layer when external bending force is applied. Therefore, the buffering ability of the flexible circuit board against the external bending force may be improved, or the risk of breaking or damaging the conductive layer may be reduced. In accordance with some embodiments of the present disclosure, the provided flexible circuit board may include an adhesive material covering the conductive layer or the cover layer, which may improve the buffering ability of the flexible circuit board against external forces, or enhance the protective effect to the flexible circuit board.

Figure 1A:
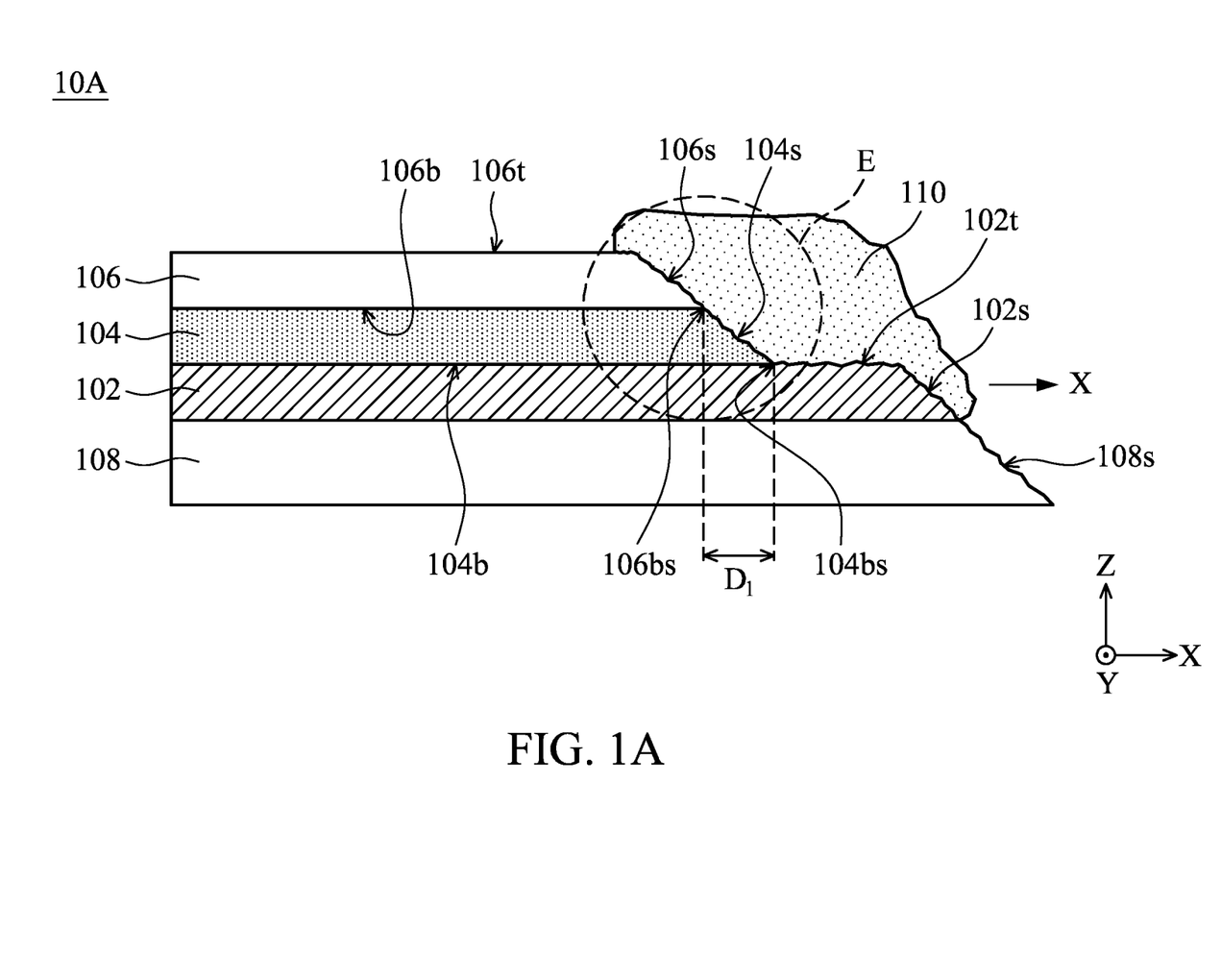
FIG. 1A is a schematic cross-sectional diagram of a flexible circuit board in accordance with some embodiments of the present disclosure.

Refer to FIG. 1A, which is a schematic cross-sectional diagram of a flexible circuit board 10A in accordance with some embodiments of the present disclosure. It should be understood that, only a partial area or part of the flexible circuit board 10A is shown in FIG. 1A for clarity. Furthermore, in accordance with some embodiments, additional features may be added to the flexible circuit board 10A described below.

As shown in FIG. 1A, in accordance with some embodiments of the present disclosure, the flexible circuit board 10A may include a first conductive layer 102, an adhesive layer 104, and a cover layer 106. The first conductive layer 102 may be used to provide electrical connections between electronic components. In some embodiments, the first conductive layer 102 may extend along a first direction X. Specifically, in accordance with some embodiments, the first direction X is defined as the direction of the X axis in the figure, and the normal direction (Z axis in the figure) is defined as the direction perpendicular to the surface of a first substrate 108 that is in contact with the first conductive layer 102. In accordance with some embodiments of the present disclosure, the term "longitudinal direction" is defined as the extending direction along the X axis in the figure.

Furthermore, the first conductive layer 102 may have a side 102s. In some embodiments, the side 102s of the first conductive layer 102 may have a non-planar profile, where the non-planar profile means that the surface has high or low undulations or wavy shape in the cross-sectional view, and the extending direction of the surface is not parallel to the first direction X.

In some embodiments, a portion of a top surface 102t of the first conductive layer 102 that is not covered by the adhesive layer 104 may serve as a bonding area between the flexible circuit board 10A and another electronic component.

In some embodiments, the material of the first conductive layer 102 may include, but is not limited to, a metal conductive material, a transparent conductive material, another suitable conductive material, or a combination thereof. In some embodiments, the aforementioned metal conductive material may include, but is not limited to, copper (Cu), silver (Ag), tin (Sn), aluminum (Al), molybdenum (Mo), tungsten (W), gold (Au), and chromium (Cr), nickel (Ni), platinum (Pt), titanium (Ti), copper alloy, silver alloy, tin alloy, aluminum alloy, molybdenum alloy, tungsten alloy, gold alloy, chromium alloy, nickel alloy, platinum alloy, titanium alloy, another suitable conductive material, or a combination thereof. In some embodiments, the aforementioned transparent conductive material may include transparent conductive oxide (TCO). For example, the transparent conductive oxide may include, but is not limited to, indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO), or a combination thereof.

In some embodiments, the adhesive layer 104 may be disposed on the first conductive layer 102 and between the first conductive layer 102 and the cover layer 106. The adhesive layer 104 may be in contact with the cover layer 106 and the first conductive layer 102, so that the cover layer 106 may be fixed on the first conductive layer 102. In addition, the adhesive layer 104 may have sides 104s. As shown in FIG. 1A, in some embodiments, the side 104s of the adhesive layer 104 may have a non-planar profile. In some embodiments, the side 104s of the adhesive layer 104 may be not aligned with the side 102s of the first conductive layer 102. In some embodiments, the side 104s of the adhesive layer 104 may shrink inward compared with the side 102s of the first conductive layer 102.

According to the foregoing, a portion of the top surface 102t of the first conductive layer 102 may serve as a bonding area of the flexible circuit board 10A. Specifically, in some embodiments, a portion of the first conductive layer 102 extending beyond the side 104s of the adhesive layer 104 may serve as a bonding area of the flexible circuit board 10A. In some embodiments, in the normal direction of the surface of the first substrate 108 (e.g., the Z direction, as shown in the figure), the portion of the first conductive layer 102 that does not overlap with the adhesive layer 104 can be used as the bonding area.

In some embodiments, the material of the adhesive layer 104 may include any suitable material having adhesive properties. In some embodiments, the material of the adhesive layer 104 may include, but is not limited to, a photo-curing adhesive material, a thermo-curing adhesive material, a photothermal-curing adhesive material, another suitable material, or a combination thereof. For example, in some embodiments, the adhesive layer 104 may include, but is not limited to, optical clear adhesive (OCA), optical clear resin (OCR), pressure sensitive adhesive (PSA), another suitable material, or a combination thereof. In some embodiments, the material of the adhesive layer 104 may include epoxy resin.

In some embodiments, the adhesive layer 104 may be formed by a spin coating process, a coating process, a printing process, another suitable process, or a combination thereof, but it is not limited thereto.

In addition, in accordance with some embodiments, the cover layer 106 may be disposed on the adhesive layer 104, and the cover layer 106 may have a side 106s. As shown in FIG. 1A, in some embodiments, the side 106s of the cover layer 106 may have a non-planar profile. In some embodiments, the side 106s of the cover layer 106 may be substantially aligned with the side 104s of the adhesive layer 104. In other words, in some embodiments, the side 104s and the side 106s may be a continuous structure.

In accordance with some embodiments, the bottom 104bs of the side 104s may protrude from the bottom 106bs of the side 106s in the first direction X. Compared with a structure in which the side 104s of the adhesive layer 104 is aligned with the side 106s of the cover layer 106, the above configuration (wherein the bottom 104bs protrudes from the bottom 106bs in the first direction X) can reduce the excessive concentration of stress on the boundary (for example, the bottom 104bs labeled in the figure) between the adhesive layer 104 and the first conductive layer 102 when external bending force is applied. Therefore, the buffering ability of the flexible circuit board 10A against external forces may be improved, or the risk of breaking or damaging the first conductive layer 102 may be reduced.

In detail, in accordance with some embodiments, the bottom 104bs of the side 104s may protrude from the bottom 106bs of the side 106s in the first direction X by a distance $D_1$. In other words, in some embodiments, the bottom 104bs and the bottom 106bs may be separated by a distance D1 in a direction substantially parallel to the top surface 102t of the first conductive layer 102 (for example, the X direction shown in the figure). Specifically, in accordance with some embodiments, the bottom 104bs is defined as the boundary between the bottom surface 104b of the adhesive layer 104 and the side 104s, and the bottom 106bs refers to the boundary between the bottom surface 106b of the cover layer 106 and the side 106s.

In some embodiments, the distance $D_1$ is in a range from 30 micrometers (μm) to 200 micrometers (μm) (i.e. 30 μm≤distance $D_1$≤200 μm), or from 30 μm to 150 μm, or from 30 μm to 100 μm, for example, 40 μm, 50 μm, 60 μm, 70 μm, 80 μm, or 90 μm.

However, in accordance with some embodiments, the range of the distance $D_1$ can be appropriately adjusted according to the product design of the flexible circuit board 10A. Alternatively, the distance $D_1$ can be greater than zero and does not affect the electrical connection of the first conductive layer 102. It should be understood that, in accordance with various embodiments, an appropriate distance $D_1$ can be selected to reduce stress concentration at the boundary between the adhesive layer 104 and the first conductive layer 102 when external bending force is applied. Therefore, electrical connection between the first conductive layer 102 and another electronic component can be well maintained.

In addition, in accordance with some embodiments of the present disclosure, an optical microscope (OM), a scanning electron microscope (SEM), a thin film thickness profiler (α-step), an ellipse thickness gauge, or other suitable means can be used to measure the thickness or length of each element, or the distance between the elements, but the disclosure is not limited thereto. Specifically, in some embodiments, a scanning electron microscope can be used to obtain a cross-sectional image of the flexible circuit board 10A and the thickness or length of each element, or the distance between the elements in the image can be measured.

In some embodiments, the cover layer 106 may include a flexible material, such as a plastic material or a ceramic material, but it is not limited thereto. In some embodiments, the aforementioned plastic material may include, but is not limited to, polyimide (PI), polyethylene terephthalate (PET), polycarbonate (PC), polyether oxime (PES), polybutylene terephthalate (PB T), polynaphthalene ethylene glycolate (PEN), polyarylate (PAR), another suitable material, or a combination thereof.

In some embodiments, the cover layer 106 may be formed by a chemical vapor deposition process, a spin coating process, a pasting process, a printing process, another suitable process, or a combination thereof, but it is not limited thereto.

In addition, in accordance with some embodiments, the flexible circuit board 10A may further include the first substrate 108, the first substrate 108 may be disposed below the first conductive layer 102, and the first conductive layer 102 may be disposed between the adhesive layer 104 and the first substrate 108. Furthermore, the first substrate 108 may have a side 108s. In some embodiments, the side 108s of the first substrate 108 may have a non-planar profile. In some embodiments, the side 108s of the first substrate 108 may be substantially aligned with the side 102s of the first conductive layer 102. In other words, in some embodiments, the side 108s and the side 102s may be continuous structures.

In some embodiments, the first substrate 108 may include a flexible material, such as a plastic material or a ceramic material, but it is not limited thereto. In some embodiments, the aforementioned plastic material may include, but is not limited to, polyimide (PI), polyethylene terephthalate (PET), polycarbonate (PC), polyether oxime (PES), polybutylene terephthalate (PBT), polynaphthalene ethylene glycolate (PEN), polyarylate (PAR), another suitable material, or a combination thereof.

In addition, as shown in FIG. 1A, in accordance with some embodiments, the flexible circuit board 10A may further include an adhesive material 110, and the adhesive material 110 may be disposed on the first conductive layer 102, the adhesive layer 104, the cover layer 106 and the first substrate 108. In some embodiments, the adhesive material 110 may partially cover the cover layer 106. In some embodiments, the adhesive material 110 may partially cover the first conductive layer 102. In other words, in some embodiments, in the normal direction of the first substrate 108 (e.g., the Z direction shown in the figure), the adhesive material 110 and the cover layer 106 may be partially overlapped. In some embodiments, in the normal direction of the first substrate 108 (e.g., the Z direction shown in the figure), the adhesive material 110 and the first conductive layer 102 may be partially overlapped.

In some embodiments, the adhesive material 110 may cover portions of a top surface 106t and the side 106s of the cover layer 106, the side 104s of the adhesive layer 104, and the side 102s of the first conductive layer 102, and the adhesive material 110 may cover a portion of the top surface 102t of the first conductive layer 102 that may serve as the bonding area.

It should be noted that, in accordance with some embodiments, the adhesive material 110 covering the first conductive layer 102 or the cover layer 106 can reduce the stress concentration at the boundary between of the adhesive layer 104 and the first conductive layer 102, or reduce the risk of breaking the first conductive layer 102, or the buffering ability of the flexible circuit board 10A against the external force can be improved.

In some embodiments, the adhesive material 110 may include, for example, anisotropic conductive film (ACF), anisotropic conductive paste (ACP), another suitable material, or a combination thereof, but it is not limited thereto. The anisotropic conductive film (ACF) or the anisotropic conductive paste (ACP) may include a polymer base and conductive particles dispersed therein. In some embodiments, the material of the polymer base may include epoxy resin, but it is not limited thereto.

In some embodiments, the adhesive material 110 may be formed by a spin coating process, a pasting process, a printing process, another suitable process, or a combination thereof.

Figure 1B:
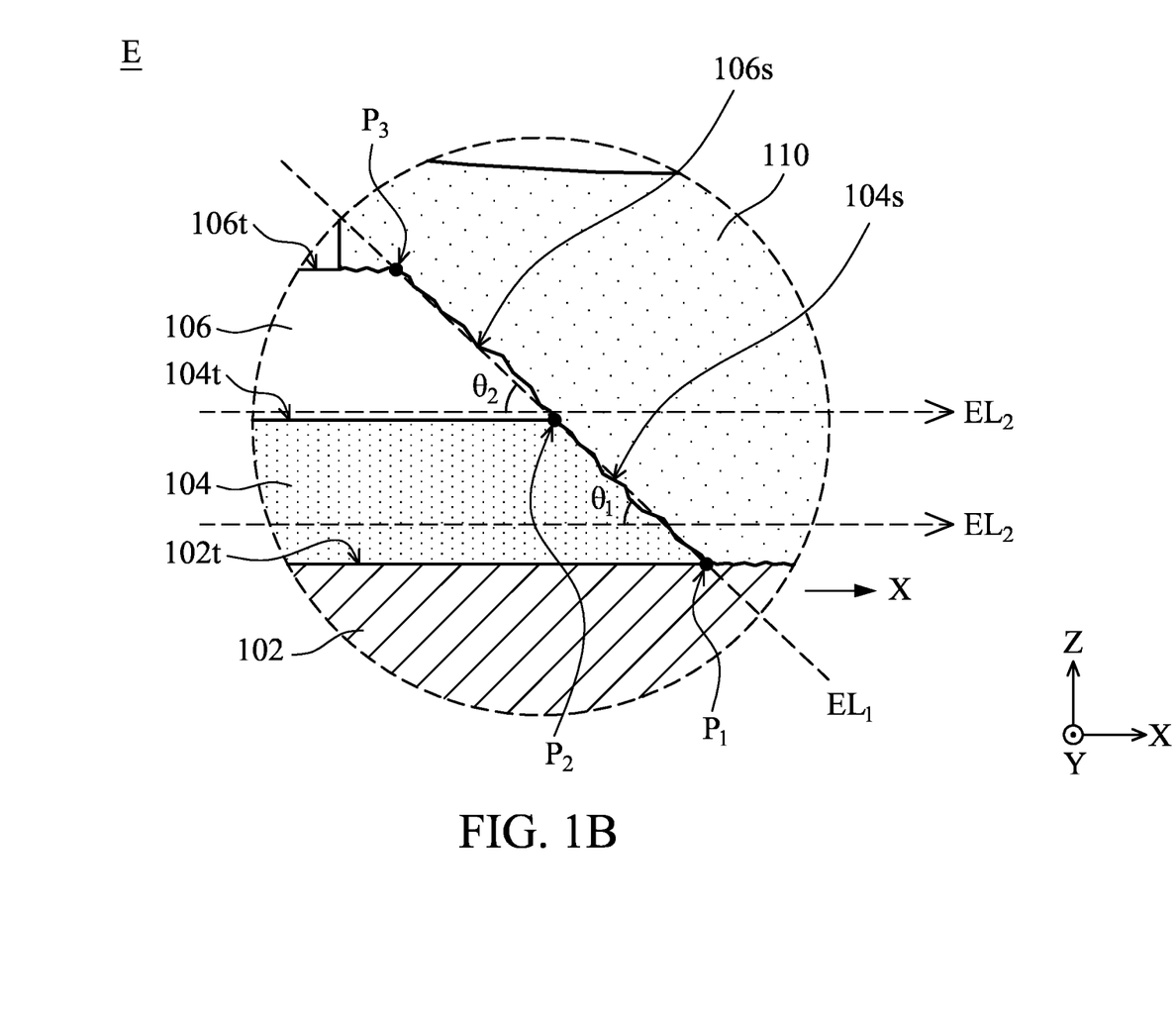
FIG. 1B is an enlarged schematic diagram of region E in FIG. 1A in accordance with some embodiments of the present disclosure.

Next, refer to FIG. 1B, which is an enlarged schematic diagram of region E in FIG. 1A in accordance with some embodiments of the present disclosure. As shown in FIG. 1B, in accordance with some embodiments, the first conductive layer 102 has the top surface 102t, the adhesive layer 104 has a top surface 104t. The top surface 102t and the side 104s of the adhesive layer 104 have a first intersection point $P_1$, and the top surface 104t and the side 106s of the cover layer 106 has a second intersection point $P_2$. In addition, a first extending line $EL_1$ passes through the first intersection point $P_1$ and the second intersection point $P_2$, and a first acute angle $\theta_1$ may exist between the first extending line $EL_1$ and a second extending line $EL_2$ of the first direction X. Specifically, the second extending line $EL_2$ is parallel to the first direction X.

In some embodiments, the first acute angle $\theta_1$ is in a range from 15 degrees to 70 degrees (i.e., 15 degrees≤the first acute angle $\theta_1$≤70 degrees), or from 30 degrees to 60 degrees, or from 30 degrees to 45 degrees, for example, 35 degrees, 40 degrees, 45 degrees, 50 degrees, or 55 degrees. It should be noted that, in the case where the first acute angle $\theta_1$ ranging from 15 degrees to 70 degrees, the side 104s of the adhesive layer 104 may present an inclined profile, which may assist in the discharge of the adhesive material 110. "The discharge of the adhesive material 110" means that the adhesive material 110 spreads along the inclined profile.

Similarly, in accordance with some embodiments, the top surface 106t of the cover layer 106 and the side 106s of the cover layer 106 have a third intersection point $P_3$, and the top surface 104t and the side 106s of the cover layer 106 have the second intersection point $P_2$. In addition, an extending line (for example, also the first extending line $EL_1$ shown in the figure) passes through the third intersection point $P_3$ and the second intersection point $P_2$. In addition, a second acute angle $\theta_2$ may exist between this extending line and the second extending line $EL_2$ that is parallel to the first direction X. In some other embodiments, the extending line passing through the first intersection point $P_1$ and the second intersection point $P_2$ may not necessarily be parallel to the extending line passing through the third intersection point $P_3$ and the second intersection point $P_2$. In other words, in some other embodiments, the two inclined surfaces (i.e. side 104s and side 106s) are not necessarily parallel to each other.

In some embodiments, the second acute angle $\theta_2$ may be from 15 degrees to 70 degrees (i.e. 15 degrees≤the second acute angle $\theta_2$≤70 degrees), or from 30 degrees to 60 degrees, or from 30 degrees to 45 degrees, for example, 35 degrees, 40 degrees, 45 degrees, 50 degrees, or 55 degrees. It should be noted in the case where the second acute angle $\theta_2$ is between 15 degrees and 70 degrees, the side 106s of the cover layer 106 may present an inclined profile, which may assist in discharge of the adhesive material 110. "The discharge of the adhesive material 110" means that the adhesive material 110 spreads along the inclined profile.

In addition, in accordance with some embodiments of the present disclosure, a scanning electron microscope can be used to obtain a cross-sectional image of the flexible circuit board 10A, and to find the aforementioned first intersection point $P_1$, second intersection point $P_2$ and third intersection point $P_3$. The first acute angle $\theta_1$ and the second acute angle $\theta_2$ then can be measured by an angle measuring instrument, but the present disclosure is not limited thereto.

Figure 2:
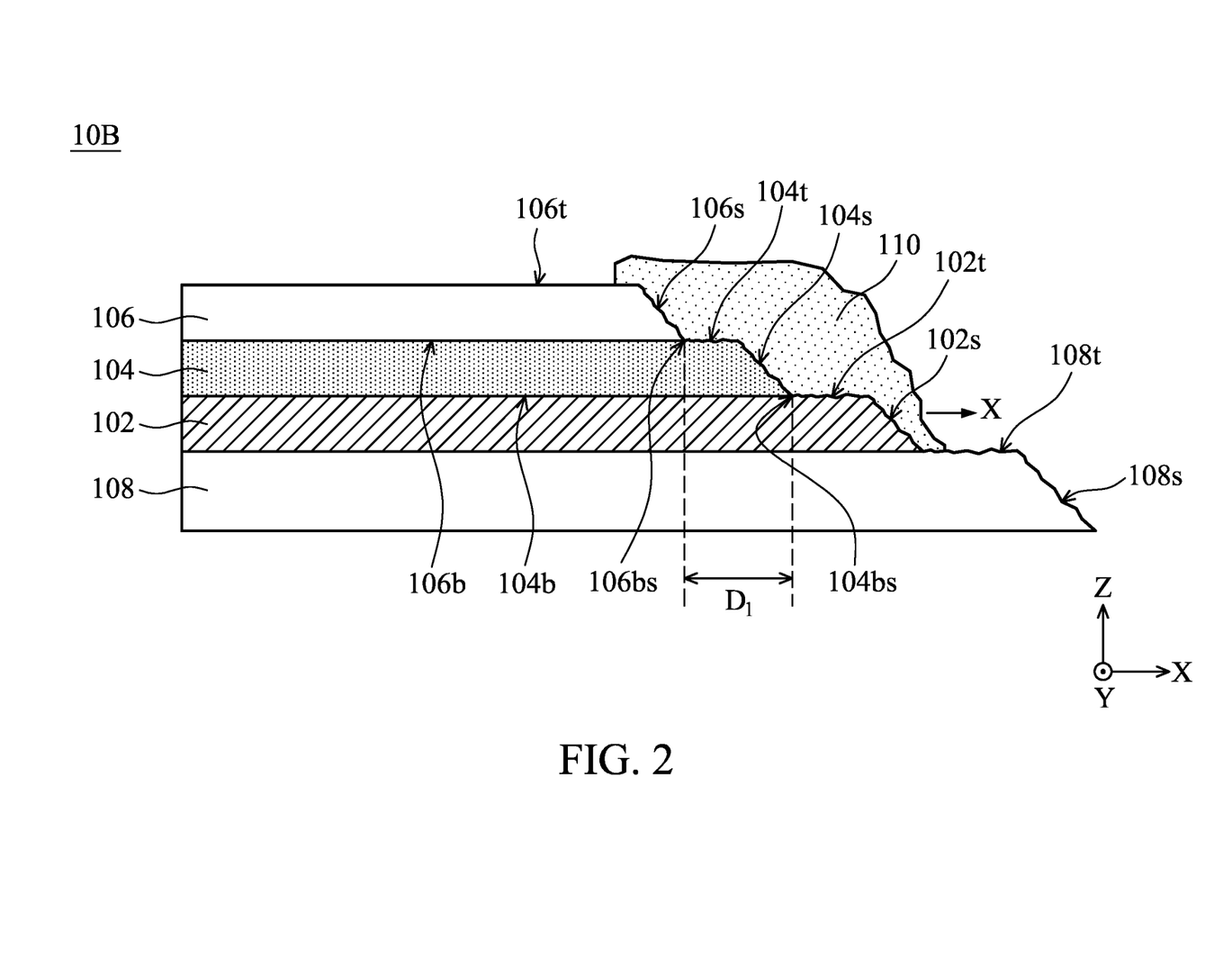
FIG. 2 is a schematic cross-sectional diagram of a flexible circuit board in accordance with some embodiments of the present disclosure.

Next, refer to FIG. 2, which is a schematic cross-sectional diagram of a flexible circuit board 10B in accordance with some other embodiments of the present disclosure. It should be understood that the same or similar components (or elements) in the following paragraph will be denoted by the same or similar reference numbers, and their materials, manufacturing methods and functions are the same or similar to those described above, and thus they will not be repeated in the following context.

The flexible circuit board 10B shown in FIG. 2 is substantially similar to the flexible circuit board 10A shown in FIG. 1A. The difference between them includes that in the flexible circuit board 10B, the side 106s of the cover layer 106 is not aligned with the side 104s of the adhesive layer 104, and the side 102s of the first conductive layer 102 is not aligned with the side 108s of the first substrate 108. In other words, in some embodiments, the side 104s and the side 106s may be discontinuous structures. In some embodiments, the side 102s and the side 108s may be discontinuous structures.

In detail, as shown in FIG. 2, in some embodiments, the cover layer 106 does not cover a portion of the top surface 104t of the adhesive layer 104. In some embodiments, the first conductive layer 102 does not cover a portion of the top surface 108t of the first substrate 108. In addition, in some embodiments, the adhesive material 110 may cover parts of the top surface 106t and the side 106s of the cover layer 106, a portion of the top surface 104t and the side 104s of the adhesive layer 104, and a portion of the top surface 102t and the side 102s of the first conductive layer 102. In some embodiments, the adhesive material 110 may also cover a portion of the first substrate 108, for example, a portion of the top surface 108t.

Figure 3:
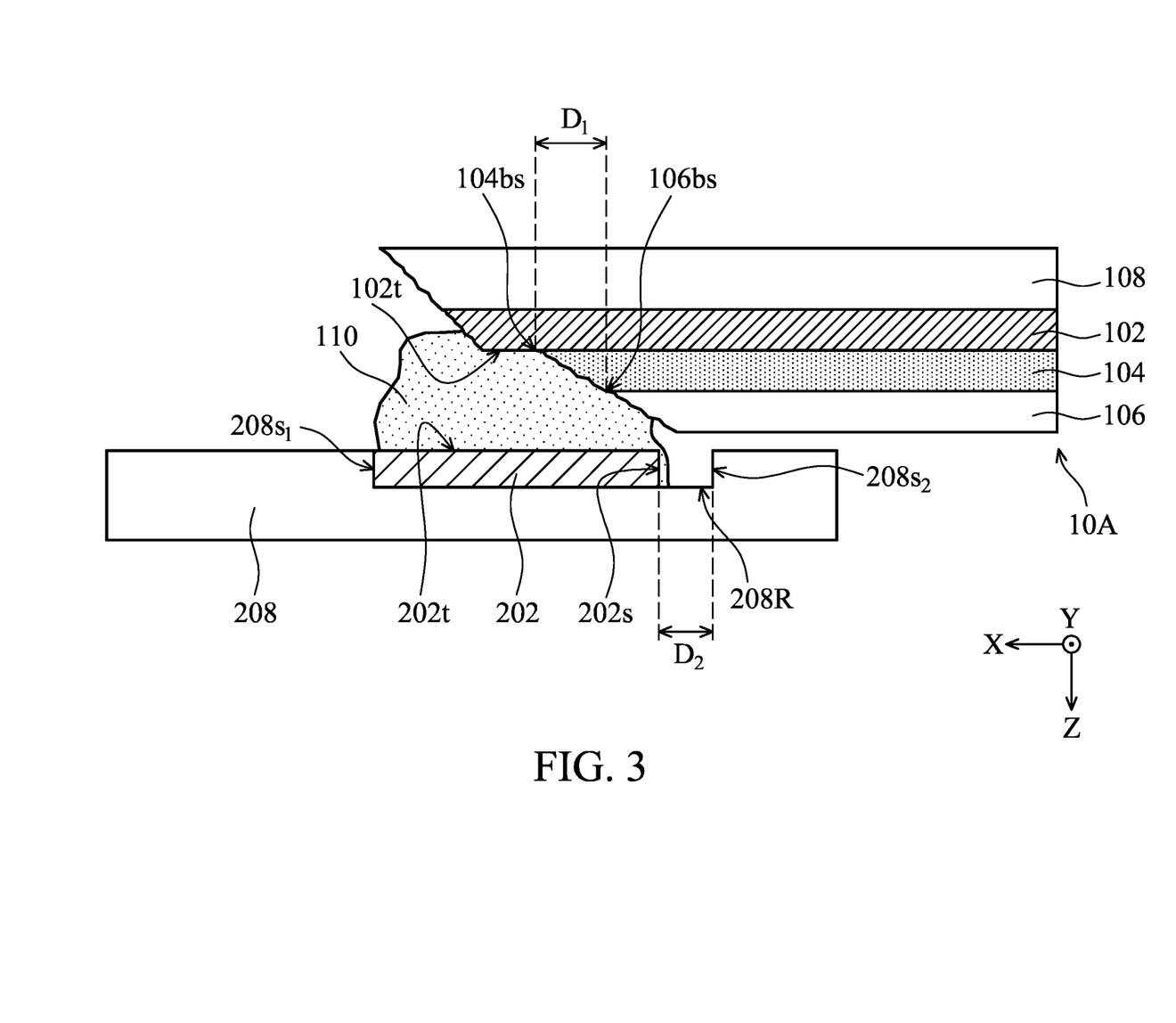
FIG. 3 is a schematic cross-sectional diagram of a flexible circuit board when it is bonded with another electronic component in accordance with some embodiments of the present disclosure.

Next, refer to FIG. 3, which is a schematic cross-sectional diagram of the flexible circuit board 10A when it is bonded with another electronic component (not labeled) in accordance with some embodiments of the present disclosure. As shown in FIG. 3, in some embodiments, the flexible circuit board 10A may be at least partially bonded to a second conductive layer 202 on a second substrate 208 by the adhesive material 110.

It should be understood that the entire structure of the electronic component is not shown in FIG. 3. In accordance with some embodiments, the second substrate 208 may be any suitable substrate in the electronic component, and the second conductive layer 202 may be any conductive structure on the substrate, for example, wires, pads, etc., but the present disclosure is not limited thereto. For example, in some embodiments, the second substrate 208 and the second conductive layer 202 may be the substrate and wires of the printed circuit board assembly (PCBA) in a display, but the present disclosure is not limited thereto.

As shown in FIG. 3, in some embodiments, the second substrate 208 may have a recess 208R, and the second conductive layer 202 may be disposed in the recess 208R. In some embodiments, the second conductive layer 202 may extend from a first side $208s_1$ of the recess 208R to a second side $208s_2$ of the recess 208R and be separated from the second side $208s_2$ by a distance $D_2$. The distance $D_2$ is defined as the minimum distance from the side 202s of the second conductive layer 202 to the second side $208s_2$ of the recess 208R in the first direction X.

In some embodiments, the distance $D_2$ may be in a range from 0.1 millimeters (mm) to 1 mm (i.e. 0.1 mm≤distance $D_2$≤1 mm), or from 0.3 mm to 0.7 mm, for example, 0.4 mm, 0.5 mm or 0.6 mm. Specifically, in accordance with some embodiments, the distance $D_2$ is defined as the minimum distance between the side 202s of the second conductive layer 202 and the second side $208Rs_2$ of the recess 208R.

In some embodiments, the adhesive material 110 may be disposed between the flexible circuit board 10A and the second substrate 208. More specifically, in some embodiments, the adhesive material 110 may be disposed between the bonding area of the first conductive layer 102 (e.g., a portion of the top surface 102t that is not covered by the adhesive layer 104) and the second conductive layer 202. In some embodiments, the first conductive layer 102 and the second conductive layer 202 at least partially overlap in the normal direction of the first substrate 108 (e.g., the Z direction shown in the figure). In some embodiments, since the adhesive material 110 includes conductive particles, the first conductive layer 102 and the second conductive layer 202 can be electrically connected by the adhesive material 110. Specifically, in some embodiments, the first conductive layer 102 and the second conductive layer 202 can be bonded to the adhesive material 110 for electrical connection through a thermocompression bonding process.

In addition, in some embodiments, in the normal direction of the first substrate 108 (e.g., the Z direction shown in the figure), the second conductive layer 202 and the cover layer 106 at least partially overlap. In some embodiments, the adhesive material 110 may cover the top surface 102t and the side 102s of the first conductive layer 102.

In accordance with some embodiments, the material of the adhesive layer 104 and the adhesive material 110 may include epoxy resin, and the same base material may improve the bonding ability of the adhesive layer 104 and the adhesive material 110 after the thermocompression process.

In some embodiments, the material of the second substrate 208 may include, but is not limited to, glass, quartz, sapphire, ceramic, plastic, another suitable substrate material, or a combination thereof. In some embodiments, the material of the plastic substrate may include, but is not limited to, polyimide (PI), polyethylene terephthalate (PET), polycarbonate (PC), polyether oxime (PES), polybutylene terephthalate (PBT), polynaphthalene ethylene glycolate (PEN), polyarylate (PAR), another suitable material, or a combination thereof. In some embodiments, the aforementioned glass material may include, but is not limited to, silicon (Si), silicon carbide (SiC), gallium nitride (GaN), silicon dioxide ($SiO_2$), another suitable material, or a combination thereof. In addition, in some embodiments, the second substrate 208 may include a metal-glass fiber composite plate, or a metal-ceramic composite plate, but it is not limited thereto.

In some embodiments, the material of the second conductive layer 202 may include, but is not limited to, a metal conductive material, a transparent conductive material, or a combination thereof. In some embodiments, the aforementioned metal conductive material may include, but is not limited to, copper (Cu), silver (Ag), tin (Sn), aluminum (Al), molybdenum (Mo), tungsten (W), gold (Au), and chromium (Cr), nickel (Ni), platinum (Pt), titanium (Ti), copper alloy, silver alloy, tin alloy, aluminum alloy, molybdenum alloy, tungsten alloy, gold alloy, chromium alloy, nickel alloy, platinum alloy, titanium alloy, another suitable conductive material, or a combination thereof. In some embodiments, the aforementioned transparent conductive material may include transparent conductive oxide (TCO). For example, the transparent conductive oxide may include, but is not limited to, indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO), or a combination thereof.

Figure 4:
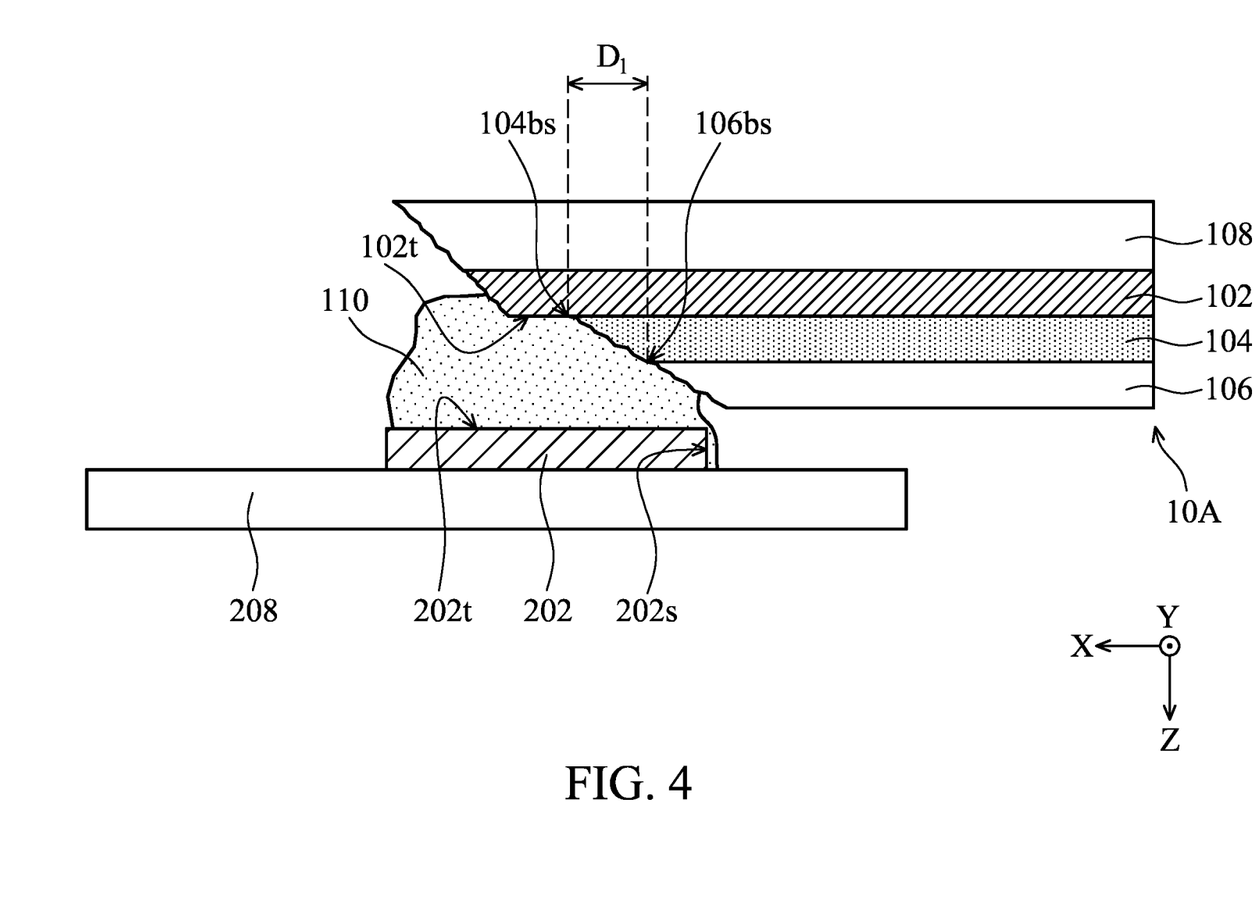
FIG. 4 is a schematic cross-sectional diagram of a flexible circuit board when it is bonded with another electronic component in accordance with some embodiments of the present disclosure.

Next, refer to FIG. 4, which is a schematic cross-sectional diagram of the flexible circuit board 10A when it is bonded with another electronic component (not labeled) in accordance with some other embodiments of the present disclosure. The embodiment shown in FIG. 4 is substantially similar to the embodiment shown in FIG. 3. The difference between them includes that in the embodiment shown in FIG. 4, the second substrate 208 of the electronic component may not have the recess 208R. In other words, in some embodiments, the second substrate 208 may have a substantially flat surface, and the flexible circuit board 10A may be at least partially bonded to the second conductive layer 202 on such the second substrate 208 by the adhesive material 110.

As described above, in accordance with some embodiments, the second substrate 208 may be a substrate in any suitable electronic device, and the second conductive layer 202 may be any conductive structure on the substrate, for example, wires, pads, etc., but the present disclosure is not limited thereto.

Figure 5A:
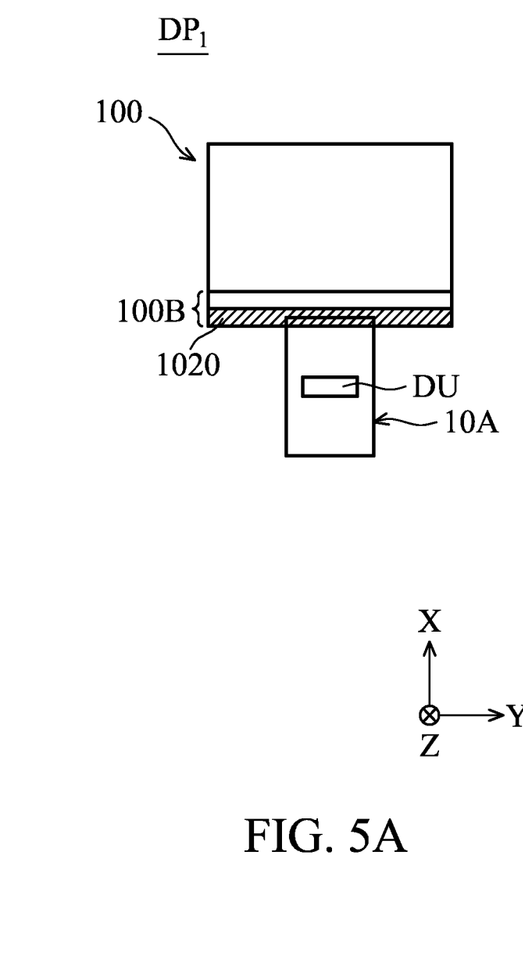
FIGS. 5A to 5C are schematic structural diagrams when a flexible circuit board in a display device is bonded with another electronic component in accordance with some embodiments of the present disclosure.
Figure 5B:
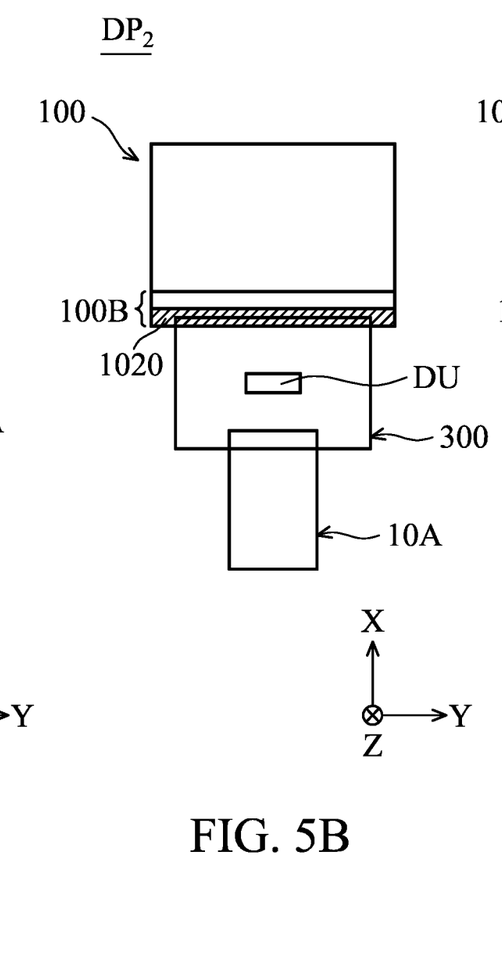
Figure 5C:
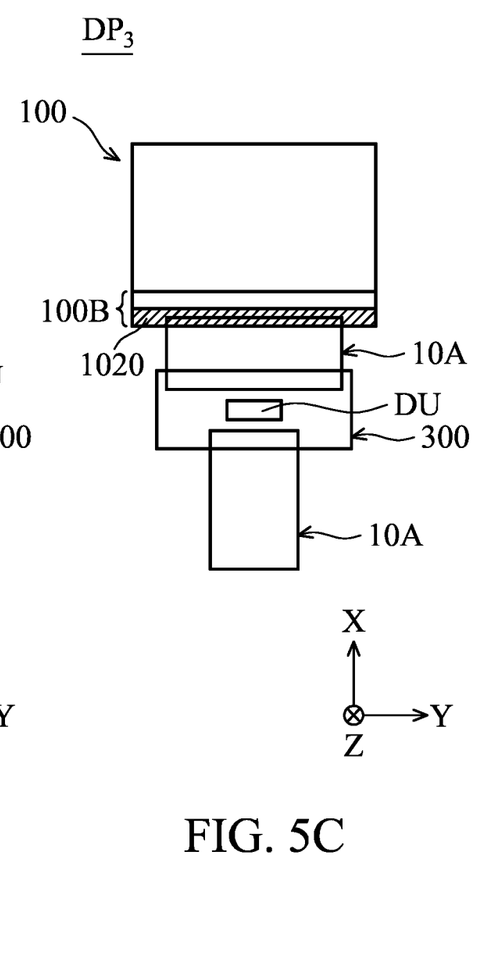

Next, refer to FIGS. 5A to 5C, which are schematic structural diagrams when a flexible circuit board in a display device $DP_1$, display device $DP_2$ and display device $DP_3$ is bonded with another electronic component (e.g., a display 100) in accordance with some embodiments of the present disclosure. It should be understood that FIGS. 5A to 5C only schematically illustrate the aspects in which the flexible circuit board 10A is bonded to the display 100. For the detailed structure of the flexible circuit board 10A and the detailed structure when it is bonded to the display 100, please refer to FIGS. 1A to 4.

As shown in FIG. 5A, in accordance with some embodiments, the display device $DP_1$ may include the flexible circuit board 10A and the display 100, and the display 100 may be disposed adjacent to the flexible circuit board 10A. In accordance with some embodiments, the display 100 may include a liquid-crystal display (LCD), a light-emitting diode (LED) display, a fluorescent display, a phosphor display, another suitable display, or a combination thereof, but it is not limited thereto. In accordance with some embodiments, the light-emitting diode display may include an organic light-emitting diode (OLED), a quantum dot light-emitting diode (QD-OLED) display, and a mini light-emitting diode, (mini LED) display, a micro light-emitting diode (micro LED) display, or a combination thereof, but it is not limited thereto. The display 100 may also be a non-rectangular display, a flexible display, a retractable display, or a portion of a tiled display, but it is not limited thereto.

In addition, in some embodiments, the display 100 may have a bonding area 100B. In some embodiments, the bonding area 100B may be disposed in the peripheral area of the display 100. In some embodiments, the display 100 may include a third conductive layer 1020, and the third conductive layer 1020 may be disposed on the bonding area 100B. In accordance with some embodiments, the material of the third conductive layer 1020 is similar to that of the second conductive layer 202 described in FIG. 3 and FIG. 4, and thus will not be repeated herein.

In some embodiments, the first conductive layer 102 of the flexible circuit board 10A may be electrically connected to the third conductive layer 1020 of the display 100, and the connection manner of the first conductive layer 102 and the third conductive layer 1020 may be, for example, refer to the that of the first conductive layer 102 and the second conductive layer 202 as shown in FIG. 3 and FIG. 4. Specifically, in accordance with some embodiments, the adhesive material 110 (as shown in FIG. 3 and FIG. 4) may be disposed between the flexible circuit board 10A and the display 100, and the flexible circuit board 10A and the display 100 may be electrically connected by the adhesive material 110.

As shown in FIG. 5A, in some embodiments, a driving element DU may be disposed on the flexible circuit board 10A, and the driving element DU may be electrically connected to the third conductive layer 1020. The driving element DU can be used to control the switch of the display 100 or adjust other functions. In some embodiments, the driving element DU may include an active driving element, a passive driving element, or a combination thereof. For example, the active driving element may include a thin-film transistor (TFT), but it is not limited thereto. The aforementioned thin-film transistor may include, for example, a switching transistor, a driving transistor, a reset transistor, or another thin-film transistor. Furthermore, the passive driving element may include an integrated circuit (IC) or a microchip, etc., but the present disclosure is not limited thereto.

Furthermore, as shown in the display device $DP_2$ of FIG. 5B, in accordance with some embodiments, a third substrate 300 may be further included between the flexible circuit board 10A and the display 100, and the third substrate 300 may be used to connect the flexible circuit board 10A and the display 100. In detail, in some embodiments, the third substrate 300 may be bonded to the bonding area 100B of the display 100. In some embodiments, the driving element DU may be disposed on the third substrate 300 and electrically connected to the display 100. Furthermore, the material of the third substrate 300 is similar to that of the aforementioned second substrate 208, and thus will not be repeated herein.

In addition, as shown in FIG. 5C, in accordance with some embodiments, the display device $DP_3$ may include a plurality of flexible circuit boards 10A. In some embodiments, the display 100 may be electrically connected to a plurality of flexible circuit boards 10A. In some embodiments, the display 100 may be connected to the third substrate 300 through one flexible circuit board 10A, and the third substrate 300 may be connected to another flexible circuit board 10A. In some embodiments, the driving element DU may be disposed on the third substrate 300 between the two flexible circuit boards 10A and electrically connected to the display 100.

According to the foregoing, FIGS. 5A to 5C schematically illustrate the aspects in which the flexible circuit board 10A is bonded to the display 100, but the present disclosure is not limited thereto. In accordance with some embodiments, according to requirements of different products, the flexible circuit board 10A may be connected and bonded with the display 100 in any other suitable manner.

To summarize the above, in accordance with some embodiments of the present disclosure, the flexible circuit board includes a design of the adhesive layer that extends beyond the cover layer, which can reduce the concentration of stress on the boundary between the adhesive layer and the conductive layer when external bending force is applied. Alternatively, the buffering ability of the flexible circuit board against external bending force may be improved, or the risk of breaking or damaging the conductive layer may be reduced. In accordance with some other embodiments of the present disclosure, the flexible circuit board may include an adhesive material covering the conductive layer or the cover layer, which may improve the buffering ability of the flexible circuit board against external forces, or enhance the protective effect to the flexible circuit board.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. An electronic device, comprising:
a flexible circuit board, comprising:
a first substrate having a first side;
a first conductive layer disposed on the first substrate, and having a top surface, a bottom surface parallel to the top surface and a second side connected between the top surface and the bottom surface;

an adhesive layer disposed on the top surface of the first conductive layer and having a third side; and a cover layer disposed on the adhesive layer and having a fourth side; and a conductive adhesive material disposed on the first conductive layer;

wherein the conductive adhesive material is in contact with the second side, wherein a first distance between a bottom point of the first side and a bottom point of the second side in a first direction is greater than zero, a second distance between a bottom point of the third side and a bottom point of the fourth side in the first direction is greater than zero, the first direction is perpendicular to a normal direction of the first substrate, and the first distance and the second distance are different.

2. The electronic device as claimed in claim 1, wherein the first substrate has a surface, and the conductive adhesive material is in contact with the surface.

3. The electronic device as claimed in claim 2, wherein the surface is a top surface.

4. The electronic device as claimed in claim 2, further comprising a second substrate and a second conductive layer, wherein the second conductive layer is disposed on the second substrate, and at least a portion of the conductive adhesive material is disposed between the first side and the second conductive layer.

5. The electronic device as claimed in claim 1, wherein the first conductive layer shrinks inward compared with the first substrate.

6. The electronic device as claimed in claim 1, further comprising a display, and the conductive adhesive material is disposed between the first conductive layer and the display.

7. The electronic device as claimed in claim 1, wherein the conductive adhesive material is in contact with the fourth side of the cover layer.

8. The electronic device as claimed in claim 1, wherein the second side has a non-planar profile.

9. An electronic device, comprising:
a flexible circuit board, comprising:
a first substrate having a first side;
a first conductive layer disposed on the first substrate, and having a top surface, a bottom surface parallel to the top surface and a second side connected between the top surface and the bottom surface;

an adhesive layer disposed on the top surface of the first conductive layer and having a third side; and a cover layer disposed on the adhesive layer and having a fourth side;

a conductive adhesive material disposed on the first conductive layer, wherein the conductive adhesive material is in contact with the second side, wherein a first distance between a bottom point of the first side and a bottom point of the second side in a first direction is greater than zero, a second distance between a bottom point of the third side and a bottom point of the fourth side in the first direction is greater than zero, the first direction is perpendicular to a normal direction of the first substrate, and the first distance and the second distance are different; and a display disposed adjacent to the flexible circuit board and having a bonding area, wherein a second conductive layer is disposed on the bonding area;

wherein the first conductive layer and the second conductive layer are electrically connected.

10. The electronic device as claimed in claim 9, wherein the first conductive layer and the second conductive layer are electrically connected by the conductive adhesive material.

11. The electronic device as claimed in claim 10, wherein the conductive adhesive material comprises a plurality of conductive particles.

12. The electronic device as claimed in claim 9, wherein the second conductive layer and the cover layer are partially overlapped in a normal direction of a surface of the first substrate.

13. The electronic device as claimed in claim 9, wherein the first substrate has a surface, and the conductive adhesive material is in contact with the surface.

14. The electronic device as claimed in claim 9, wherein the first conductive layer shrinks inward compared with the first substrate.

15. The electronic device as claimed in claim 9, further comprising a second substrate, wherein the second conductive layer is disposed on the second substrate, and at least a portion of the conductive adhesive material is disposed between the first side and the second conductive layer.

* * * * *